United States Patent
Richardson et al.

(10) Patent No.: US 8,134,188 B2
(45) Date of Patent: Mar. 13, 2012

(54) CIRCUITS AND METHODS FOR IMPROVED FET MATCHING

(75) Inventors: Kenneth G. Richardson, Erie, CO (US); Michael Straub, Longmont, CO (US)

(73) Assignee: AGERE Systems Inc., Allentown, PA (US)

( * ) Notice: Subject to any disclaimer, the term of this patent is extended or adjusted under 35 U.S.C. 154(b) by 691 days.

(21) Appl. No.: 11/838,546

(22) Filed: Aug. 14, 2007

(65) Prior Publication Data

US 2008/0048267 A1     Feb. 28, 2008

Related U.S. Application Data

(60) Provisional application No. 60/839,631, filed on Aug. 23, 2006.

(51) Int. Cl.
*H01L 29/80* (2006.01)

(52) U.S. Cl. .. 257/256; 257/202; 257/272; 257/E29.024

(58) Field of Classification Search ................ 257/202, 257/365, E29.024, 256, 272
See application file for complete search history.

(56) References Cited

U.S. PATENT DOCUMENTS 6,815,740 B2 * 11/2004 Nelson et al. ................. 257/275

* cited by examiner

*Primary Examiner* — Zandra Smith
*Assistant Examiner* — Jamie C Niesz
(74) *Attorney, Agent, or Firm* — Hamilton DeSanctis & Cha

(57) ABSTRACT

Various embodiments of the present invention provide circuits and methods for improved FET matching. As one example, such methods may include providing two or more transistors. Each of the transistors includes a channel that varies in cross-sectional width from the source to the drain, and the transistors are matched one to another.

28 Claims, 7 Drawing Sheets

US 8,134,188 B2

CIRCUITS AND METHODS FOR IMPROVED FET MATCHING

CROSS REFERENCE TO RELATED APPLICATIONS

The present application claims priority to (is a non-provisional of) U.S. Pat. App. No. 60/839,631, entitled "Method to Improve FET Matching", and filed Aug. 23, 2006 by Richardson. The entirety of the aforementioned provisional patent application is incorporated herein by reference for all purposes.

BACKGROUND OF THE INVENTION

The present invention is related to circuits and methods for implementing transistor devices, and more particularly to circuits and methods for reducing mismatch across transistor devices.

A typical semiconductor device includes a large number of transistors configured to perform one or more functions germane to the operation of the semiconductor device. In some cases, operation of the semiconductor device may be limited due to mismatches between transistors incorporated on the semiconductor device. Such mismatches include a variance in threshold voltage ($V_T$), length (L) and width (W) across transistors. As some examples, a mismatch in transistors used in a current mirror or differential pair can lead to subtle operational differences that may in some cases be fundamental to proper operation.

FIGS. 1a-1b show an exemplary current mirror 100 and an exemplary differential input pair 150 where a mismatch in transistors results in an undesirable operational variance. Current mirror 100 includes a PMOS transistor 102 and two resistors 104, 106. In addition, current mirror 100 includes three NMOS transistors 108, 110, 112. In operation, a voltage (Vin) 114 is applied to the gate of PMOS transistor 102. This causes PMOS transistor 102 to turn on such that the drain of PMOS transistor 102 exhibits a voltage near that of the source of PMOS transistor 102. The voltage at the drain of PMOS transistor 102 is applied to the drain of NMOS transistor 108, and the gates of NMOS transistors 108, 110, 112. This results in a reference current 116 (Ir) traversing PMOS transistor 102 and NMOS transistor 108. Currents 118, 120 (Ia, Ib) proportional to reference current 116 traverse NMOS transistor 110 and NMOS transistor 112, respectively. The following equations describe proportional currents 118, 120:

$Ia = k1 * Ir$; and $Ib = k2 * Ir$.

The constant k1 is the ratio of the area of NMOS transistor 108 to NMOS transistor 110, and the constant k2 is the ratio of the area of NMOS transistor 108 to NMOS transistor 112. As can be readily appreciated, any variance in the width or length in any of NMOS transistor 108, NMOS transistor 110 or NMOS transistor 112 has a direct impact on the relationship of each of proportional currents 118, 120.

Turning to FIG. 1b, differential input pair 150 is depicted. Differential input pair 150 includes an NMOS transistor 152 and an NMOS transistor 154. The drain of NMOS transistor 152 is electrically coupled to a resistor 156 and a positive output 164 (Vout+), and the drain of NMOS transistor 154 is electrically coupled to a resistor 158 and to a negative output 160 (Vout−). The gate of NMOS transistor 152 is electrically coupled to a positive input 162 (Vin+), and the gate of NMOS transistor 154 is electrically coupled to a negative input 160 (Vin−). The source of each of NMOS transistors 152, 154 are electrically coupled to each other, and to a current source 168. Ideally, when positive input 162 equals negative input 164, the same current (i.e., ½ current source 168) should traverse each of resistors 156, 158 such that positive output 164 equals negative output 166. However, where the threshold voltage of NMOS transistor 152 is different from that of NMOS transistor 154, positive output 164 will not equal negative output 166 when positive input 162 equals negative input 160. Thus, a variance in threshold voltage across transistors has a direct and undesirable impact on circuit performance.

In some cases variance in threshold voltage, width and length across transistors exhibits an absolute maximum. Thus, an increase in area of a transistor minimizes the impact of any length or width variance. This is, however, contrary to trends in the semiconductor area where reduced transistor sizes are desired. Indeed, as transistor sizes continue to decrease, the impact of variances is becoming more and more significant. Some attempts to reduce the variance have involved decreasing the resolution of semiconductor manufacturing equipment to further limit any variance. While such attempts have generally been successful, a certain variance across transistors is still expected.

Hence, for at least the aforementioned reasons, there exists a need in the art for advanced systems and methods for implementing transistors.

BRIEF SUMMARY OF THE INVENTION

The present invention is related to circuits and methods for implementing transistor devices, and more particularly to circuits and methods for reducing mismatch across transistor devices.

Various embodiments of the present invention provide methods for reducing the impact of inter-transistor variance. Such embodiments include providing a first and a second matching transistor. The first transistor includes a first channel that varies in cross-sectional width from the source to the drain, and the second transistor includes a second channel that varies in cross-sectional width from the source to the drain. In some cases of the aforementioned embodiments of the present invention, providing the first transistor includes physically shaping the first channel such that a first cross-sectional width of the first channel near the source is less than a second cross-sectional width of the first channel near the drain. Such physical shaping may result in either a smooth edge or a stepped edge on the first channel. In other cases of the aforementioned embodiments, providing the first transistor includes providing a plurality of component transistors with the plurality of component transistors electrically coupled such that the first channel is an effective channel extending from a drain of one of the plurality of component transistors to a source of another of the plurality of component transistors. In some such cases, the plurality of component transistors includes transistors of at least two different sizes resulting in an effective channel that has a first cross-sectional width near the source and a second cross-sectional width near the drain. In particular cases, the first cross-sectional width is less than the second cross-sectional width.

In some particular instances of the aforementioned embodiments, the first transistor is implemented in one side of a differential circuit, and the second transistor is implemented in another side of the differential circuit. In such cases, the area of the first channel may be substantially the same as the area of the second channel. In other particular instances of the aforementioned embodiments, the first transistor is implemented in one stage of a current mirror and the second transistor is implemented in another stage of the current mirror. In such cases, an area of the first channel may be a multiple of the area of the second channel. The multiple may be unity or some other multiple.

Other embodiments of the present invention provide transistors that each include a drain, a source and a channel extending between the drain and the source. A cross-sectional width of the channel near the source is substantially less than a cross-sectional width of the channel near the drain. In some instances of the aforementioned embodiments, the transistor includes a plurality of component transistors that are electrically coupled such that the channel is an effective channel extending from a drain of one of the plurality of component transistors to a source of another of the plurality of component transistors. In particular cases, the plurality of component transistors includes transistors of at least two different sizes and the effective channel has a first cross-sectional width near the source and a second cross-sectional width near the drain, and wherein the first cross-sectional width is less than the second cross-sectional width.

In other instances of the aforementioned embodiments, the transistor is a first transistor with a first drain, a first source and a first channel. In such instances, the first transistor may be part of a matched transistor pair that additionally includes a second transistor. The second transistor includes a second drain, a second source and a second channel extending between the second drain and the second source. A cross-sectional width of the second channel near the second source is substantially less than a cross-sectional width of the second channel near the second drain. In such instances, the transistor pair may be configured as a differential pair where an area of the first channel is approximately the same as the area of the second channel. Alternatively, the transistor pair may be implemented as part of a current mirror. In such cases, a proportional current provided by the current mirror is a reference current multiplied by a ratio of an area of the first channel and an area of the second channel.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

Figure 1A:
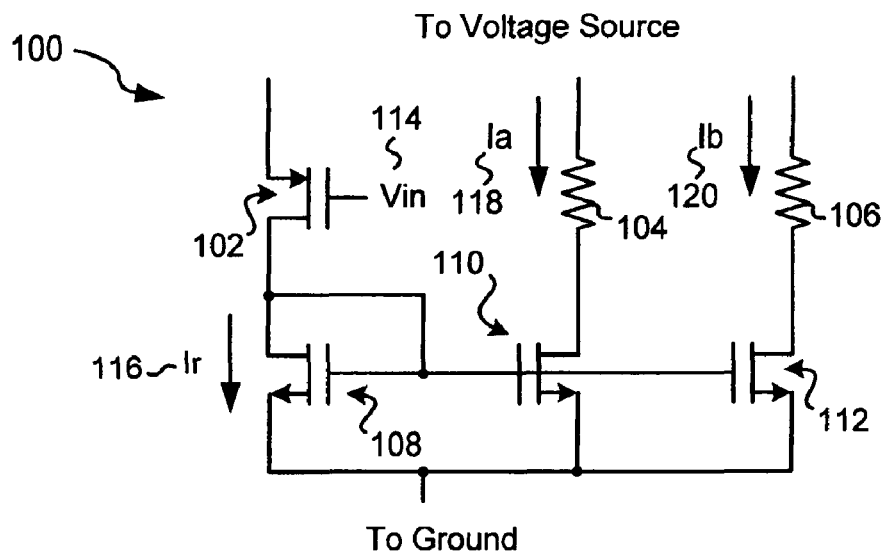
FIG. 1a shows an exemplary prior art current mirror.
Figure 1B:
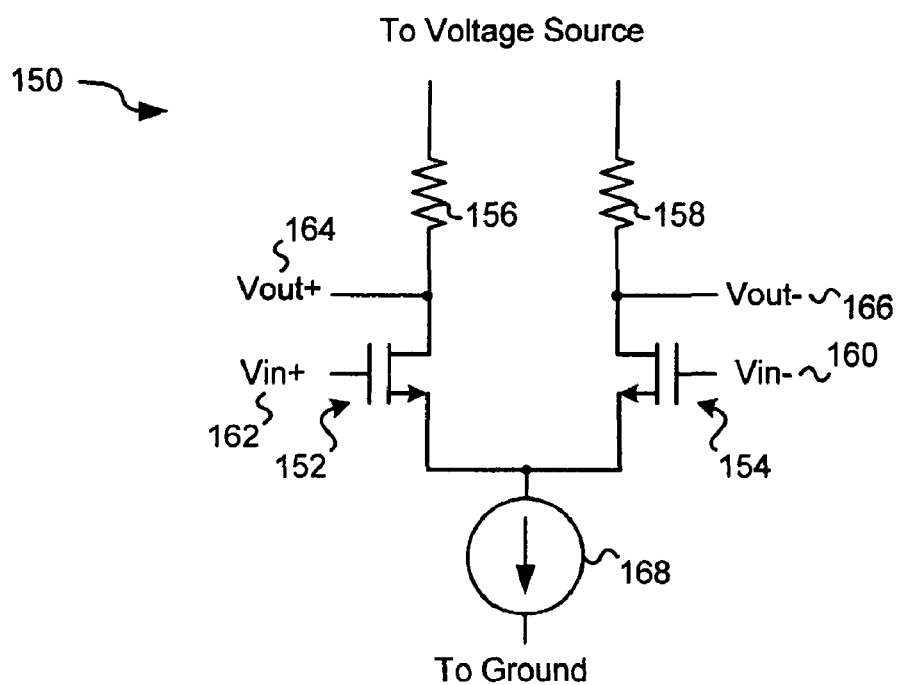
FIG. 1b depicts an exemplary prior art differential pair.

The present invention is related to circuits and methods for implementing transistor devices, and more particularly to circuits and methods for reducing mismatch across transistor devices.

Field Effect Transistors (FET) exhibit at least two operational conditions including a triode condition and a saturation condition. The saturation condition is described by the following equation:

$$V_{DS} > V_{GS} - V_T,$$

where $V_{DS}$ is the drain to source voltage drop, and $V_{GS}$ is the gate to source voltage drop. The triode condition is described by the following equation:

$$V_{DS} < V_{GS} - V_T.$$

When operating in the triode condition, a FET is conducting in an Ohmic manner and is less sensitive to changes in the $(V_{GS}-V_T)$ term when compared with operation in the saturation condition. Hence, in the triode condition, variance in $V_T$ is less critical in comparison to the impact of variance when operating in the saturation condition.

When operating in the saturation condition, voltage drops in a non-uniform manner from the drain to the source across the device channel. Therefore, voltage applied at the gate of a device exerts a corresponding non-uniform control over the carrier density in the channel. In particular, the voltage drop per unit distance will tend to increase along a line extending from the source to the drain end of a FET. Because of this, devices at the drain end of a FET have a greater influence over the carriers in the channel. The area under the gate located closest to the source end of the FET tends to act more like a device in triode as the gate has less relative influence over the carriers at that location in the device. Hence, the impact of transistor variance is greater near the drain end of the FET than at the source end.

It has been discovered that when series transistors or other combinations of transistors are utilized, better matching between the different transistors may be had without incurring an overall increase in transistor area through use of varied channel shapes. In particular, better matching may be achievable per unit total of transistor area where a transistor channel has a variable width. In one particular case, a variable width that increases from the source to the drain end of the transistor has been found to be favorable.

Some embodiments of the present invention provide for transistor devices that are physically and/or electrically shaped to take advantage of the aforementioned device operation to reduce the impact of variance when compared with a traditional rectangular device of approximately the same area. Various embodiments of the present invention provide for transistor devices that are physically and/or electrically shaped to take advantage of the previously described device operation to provide transistor devices that exhibit susceptibility to variance comparable to that exhibited by traditional rectangular devices implemented in larger areas. One or more embodiments of the present invention shape the transistor by modifying the cross-sectional width of the transistor channel between the drain and source of the transistor. Particular embodiments of the present invention include one or more channels extending from a drain to source where the channel has a greater cross-sectional width near the drain end of the channel compared with the cross-sectional width near the source end of the channel. In some cases, the transition between the source and drain is substantially smooth, while in other cases the transition between source and drain is stepped. Other particular embodiments of the present invention combine a number of rectangular transistors to provide a composite transistor exhibiting a narrower channel cross-section near the source of the device when compared with the channel cross-section near the drain of the device. Based on the disclosure provided herein, one of ordinary skill in the art will recognize a variety of other uses for transistors shaped in accordance with the various embodiments of the present invention.

Figure 2A:
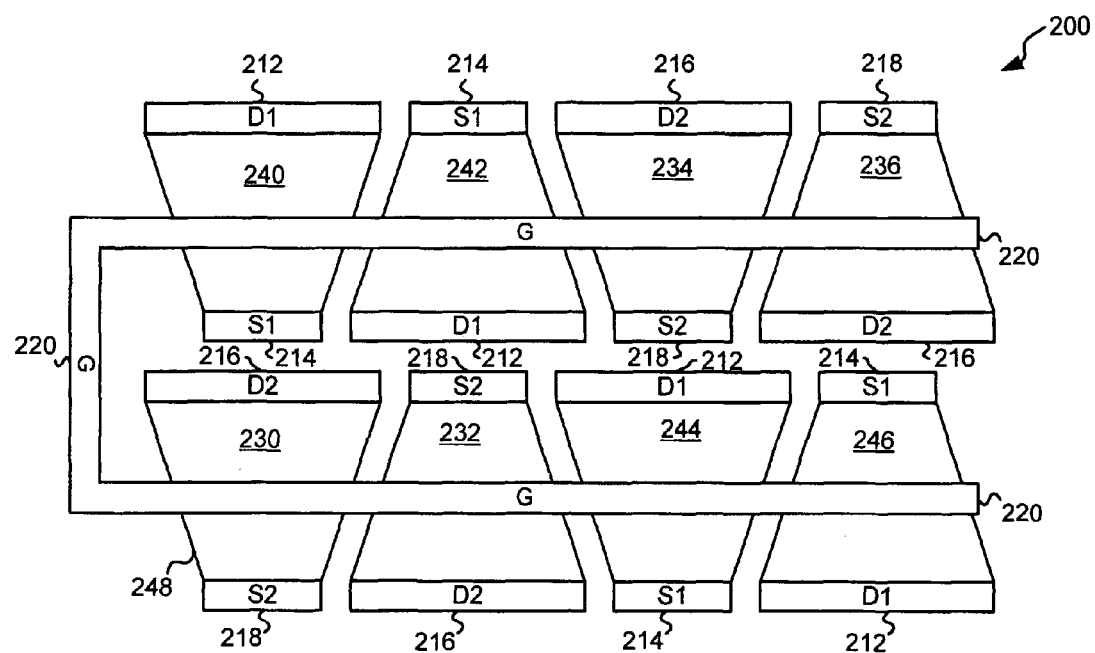
FIG. 2a shows a two transistor layout with smooth channels where a cross-sectional width of the channels near the drain is greater than the cross-sectional width near the source in accordance with one or more embodiments of the present invention.
Figure 2A:
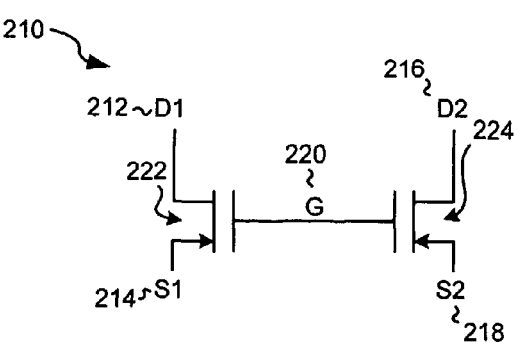

Turning to FIG. 2a, a two transistor layout 200 is shown including smooth channels where a cross-sectional width of the channels near the drain is greater than the cross-sectional width near the source in accordance with one or more embodiments of the present invention. Transistor layout 200 is schematically represented by a schematic 210. As shown, schematic 210 includes two NMOS transistors 222, 224. It should be noted that while NMOS transistors are depicted, PMOS transistors may be used in accordance with the embodiments of the present invention. NMOS transistor 222 includes a drain 212 (D1) and a source 214 (S1). Similarly, NMOS transistor 224 includes a drain 216 (D2) and a source 218 (S2). A common gate 220 (G) is used for both NMOS transistor 222 and NMOS transistor 224.

As shown, each transistor is shown to include four drains that are electrically coupled to each other (e.g., D1), four sources that are electrically coupled to each other (e.g., S1), and four channels extending between the drain/source pairs. It should be noted that transistors with shaped channels may be formed using only a single drain/source pair, or any number of drain/source pairs in accordance with different embodiments of the present invention. In some cases, it may be desirable to use source/pairs that are powers of two as the shape of the channel is complimentary and use of pairs may provide for certain area efficiencies when implementing such transistors in generally rectangular regions of a semiconductor die.

Transistor layout 200 includes: two sources 214 (S1) that are electrically coupled to each other, two drains 212 (D1) that are electrically coupled to each other, two sources 218 (S2) that are electrically coupled to one another, and two drains 216 (D2) that are electrically coupled to each other. In addition, transistor layout 200 includes four channels 240, 242, 244, 246 extending between source 214 (S1) and drain 212 (D1); and four channels 230, 232, 234, 236 extending between source 218 (S2) and drain 216 (D2). Gate 220 (G) is disposed above each of 230, 232, 234, 236, 240, 242, 244, 246. The identified drain, source, gate and channel regions may be created using one or more methods known in the art for manufacturing semiconductor devices. Thus, for example, known doping and metallization techniques may be used to create drain, source, gate and channel regions. In operation, a voltage is applied to gate 220 causing NMOS transistors 222, 224 to operate in either the triode condition or the saturation condition depending upon the magnitude of the applied voltage.

As shown, each of channels 230, 232, 234, 236, 240, 242, 244, 246 exhibits a smooth transition 248 between the associated drains and sources. As used herein, the phrase "smooth transition" is used in its broadest form to mean any edge that is substantially free of right angles. Thus, for example, a smooth transition may be a straight edge extending between associated drains and sources. As another example, a smooth transition may be a curvilinear edge extending between associated drains and sources. Also, as used herein, the phrase "physically shaped" is used in its broadest sense to mean any area whose edges or shape are defined physically. Thus, using a masking process capable of defining a tapered channel results in a physically shaped channel. Based on the disclosure provided herein, one of ordinary skill in the art will recognize a variety of smooth transitions that may be used to define channels in accordance with one or more embodiments of the present invention.

Further, each of channels 230, 232, 234, 236, 240, 242, 244, 246 exhibits a cross-sectional width that is narrower near the source end than at the drain end of the respective channel. As used herein, the phrase "cross-sectional width" is used in its broadest sense to mean any distance across a channel that runs substantially perpendicular to the channel. Among other things, transistor layout 200 takes advantage of the difference in operational characteristics near the source end and the drain end of the channel to reduce the impact in any variance between NMOS transistor 222 and NMOS transistor 224 as described above.

Figure 2B:
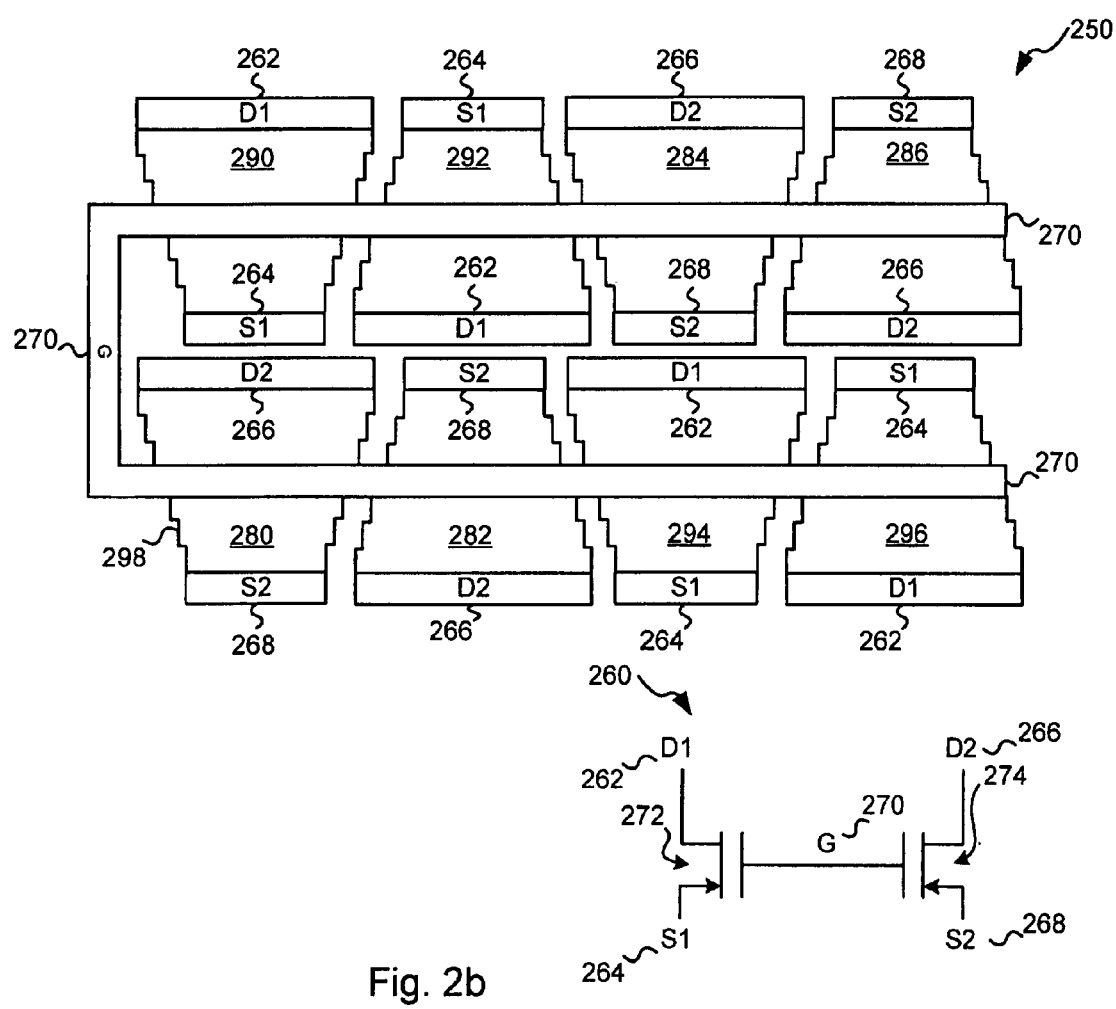
FIG. 2b shows a two transistor layout with stepped channels where a cross-sectional width of the channels near the drain is greater than the cross-sectional width near the source in accordance with other embodiments of the present invention.

In some cases, existing design tools and/or semiconductor manufacturing equipment make it difficult to create a channel exhibiting a smooth transition between a source of one width and a drain of another width. At least in part to accommodate this limitation, some embodiments of the present invention provide transistor layouts that include stepped channels where a cross-sectional width of the channels near one end of the device is greater than that of the other end of the device. Turning to FIG. 2b, a two transistor layout 250 is shown including stepped channels where a cross-sectional width of the channels near the drain is greater than the cross-sectional width near the source in accordance with other embodiments of the present invention. Transistor layout 250 is schematically represented by a schematic 260. As shown, schematic 260 includes two NMOS transistors 272, 274. Again, it should be noted that while NMOS transistors are depicted, PMOS transistors may be used in accordance with the embodiments of the present invention. NMOS transistor 272 includes a drain 262 (D1) and a source 264 (S1). Similarly, NMOS transistor 274 includes a drain 266 (D2) and a source 268 (S2). A common gate 270 (G) is used for both NMOS transistor 272 and NMOS transistor 274.

Transistor layout 250 includes: two sources 264 (S1) that are electrically coupled to each other, two drains 262 (D1) that are electrically coupled to each other, two sources 268 (S2) that are electrically coupled to one another, and two drains 266 (D2) that are electrically coupled to each other. In addition, transistor layout 250 includes four channels 290, 292, 294, 296 extending between source 264 (S1) and drain 262 (D1); and four channels 280, 282, 284, 286 extending between source 268 (S2) and drain 266 (D2). Gate 270 (G) is disposed above each of 280, 282, 284, 286, 290, 292, 294, 296. The identified drain, source, gate and channel regions may be created using one or more methods known in the art for manufacturing semiconductor devices. Thus, for example, known doping and metallization techniques may be used to create drain, source, gate and channel regions. In operation, a voltage is applied to gate 220 causing NMOS transistors 272, 274 to operate in either the triode condition or the saturation condition depending upon the magnitude of the applied voltage.

As shown, each of channels 280, 282, 284, 286, 290, 292, 294, 296 exhibits a stepped transition 298 between the associated drains and sources. As used herein, the phrase "stepped transition" is used in its broadest form to mean any edge that includes one or more right angles forming steps. Thus, for example, a stepped transition may include a number of vertical and horizontal transitions that together extend between associated drains and sources. Based on the disclosure provided herein, one of ordinary skill in the art will recognize a variety of stepped transitions that may be used to define channels in accordance with one or more embodiments of the present invention. Further, each of channels 280, 282, 284, 286, 290, 292, 294, 296 exhibits a cross-sectional width that is narrower near the source end than at the drain end of the respective channel. Among other things, transistor layout 250 takes advantage of the difference in operational characteristics near the source end and the drain end of the channel to reduce the impact in any variance between NMOS transistor 272 and NMOS transistor 274 as described above.

Figure 3:
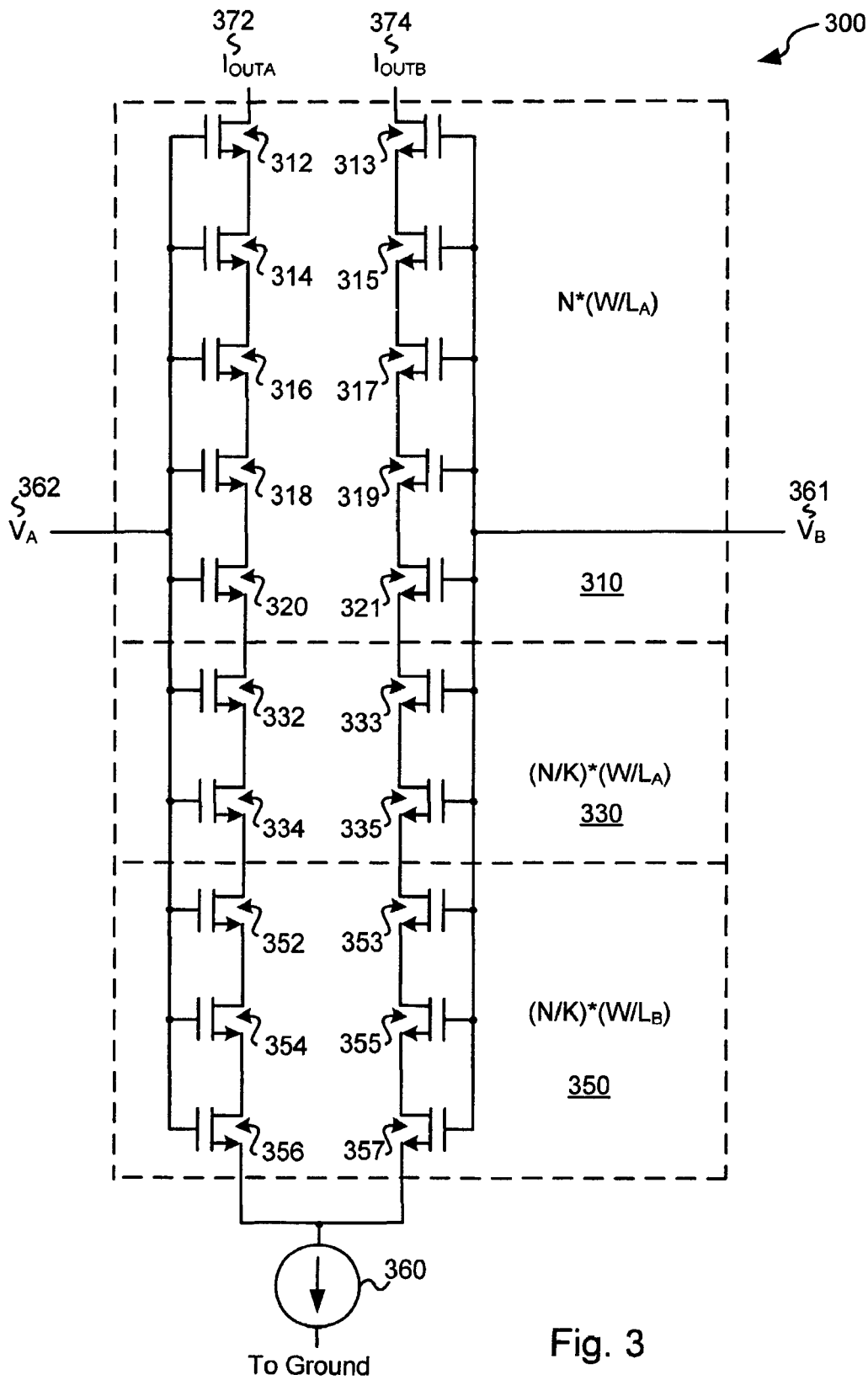
FIG. 3 shows a differential pair formed of multiple component transistors to yield effective channels where a cross-sectional width of the channels near the drain is greater than the cross-sectional width near the source in accordance with various embodiments of the present invention.

Various design tools and/or semiconductor manufacturing equipment make it difficult to create a channel with a sufficiently fine length between steps. At least in part to accommodate this limitation, some embodiments of the present invention provide transistor layouts that include a number of component transistors combined to yield effective channels where a cross-sectional width of the channels near the drain is greater than the cross-sectional width near the source. Turning to FIG. 3, a differential pair 300 is depicted that is formed of multiple component transistors to yield effective channels where a cross-sectional width of the channels near the drain is greater than the cross-sectional width near the source in accordance with various embodiments of the present invention Differential pair 300 includes a positive input 362 ($V_A$) that is applied to the gates of a number of component transistors 312, 314, 316, 318, 320, 332, 334, 352, 354, 356. In addition, differential pair 300 includes a negative input 364 ($V_B$) that is applied to the gates of a number of other component transistors 313, 315, 317, 319, 321, 333, 335, 353, 355, 357. As shown, each of component transistors 312, 313, 314, 315, 316, 317, 318, 319, 320, 321, 332, 333, 334, 335, 352, 353, 354, 355, 356, 357 are NMOS transistors. It should be noted that other embodiments of the present invention may be implemented using PMOS transistors. Based on the disclosure provided herein, one of ordinary skill in the art will recognize various combinations of component transistors that may be used in relation to different embodiments of the present invention.

The drain of component transistor 312 is electrically coupled to a current output 372 ($I_{OUTA}$). The source of component transistor 312 is electrically coupled to the drain of component transistor 314; the source of component transistor 314 is electrically coupled to the drain of component transistor 316; the source of component transistor 316 is electrically coupled to the drain of component transistor 318; the source of component transistor 318 is electrically coupled to the drain of component transistor 320; the source of component transistor 332 is electrically coupled to the drain of component transistor 334; the source of component transistor 334 is electrically coupled to the drain of component transistor 352; the source of component transistor 352 is electrically coupled to the drain of component transistor 354; the source of component transistor 354 is electrically coupled to the drain of component transistor 356; and the source of component transistor 356 is electrically coupled to a current source 360. The drain of component transistor 313 is electrically coupled to a current output 374 ($I_{OUTB}$). The source of component transistor 313 is electrically coupled to the drain of component transistor 315; the source of component transistor 315 is electrically coupled to the drain of component transistor 317; the source of component transistor 317 is electrically coupled to the drain of component transistor 319; the source of component transistor 319 is electrically coupled to the drain of component transistor 321; the source of component transistor 333 is electrically coupled to the drain of component transistor 335; the source of component transistor 335 is electrically coupled to the drain of component transistor 353; the source of component transistor 353 is electrically coupled to the drain of component transistor 355; the source of component transistor 355 is electrically coupled to the drain of component transistor 357; and the source of component transistor 357 is electrically coupled to a current source 360.

The aforementioned component transistors are collected into groups of component transistors. In particular, component transistors 312, 313, 314, 315, 316, 317, 318, 319, 320, 321 are included in a group 310, and are each of a size $N*(W/L_A)$. N is the number of fingers included in each of the transistors, W is the width of each of the transistors, and $L_A$ is the length of each of the transistors. Component transistors 332, 333, 334, 335 are included in a group 330, and are each of a size $(N/K)*(W/L_A)$. N/K is the number of fingers included in each of the transistors. Component transistors 352, 353, 354, 355, 356, 357 are included in a group 350, and are each of a size $(N/K)*(W/L_B)$. $L_B$ is the length of each of the transistors.

The combination of component transistors define two effective transistors (i.e., one effective transistor including the component transistors on the left, and the other effective transistor including the component transistors on the right). The left side effective transistor has an effective channel extending from the drain of component transistor 312 to the source of component transistor 356. The right side effective transistor has an effective channel extending from the drain of component transistor 313 to the source of component transistor 357. As an example, where K is greater than one, the number of fingers included in each of the component transistors in group 330 is less than that of group 310. Therefore, the total area of each of the component transistors in group 310 is greater than that of the component transistors in group 330. Further, where the product of $(N/K)/L_B$ is less than the product of $N/L_A$, the area of each of the transistors in group 350 is less than that of group 310. By utilizing combinations of different sized component transistors such as those exemplified in differential pair 300, the channel extending from the drain to source of the effective transistors may be effectively tapered such that a cross-sectional width near the source is different from the cross-sectional width near the drain. In this particular case, the cross-sectional width near the drain is larger than the cross-sectional width near the source.

Figure 4:
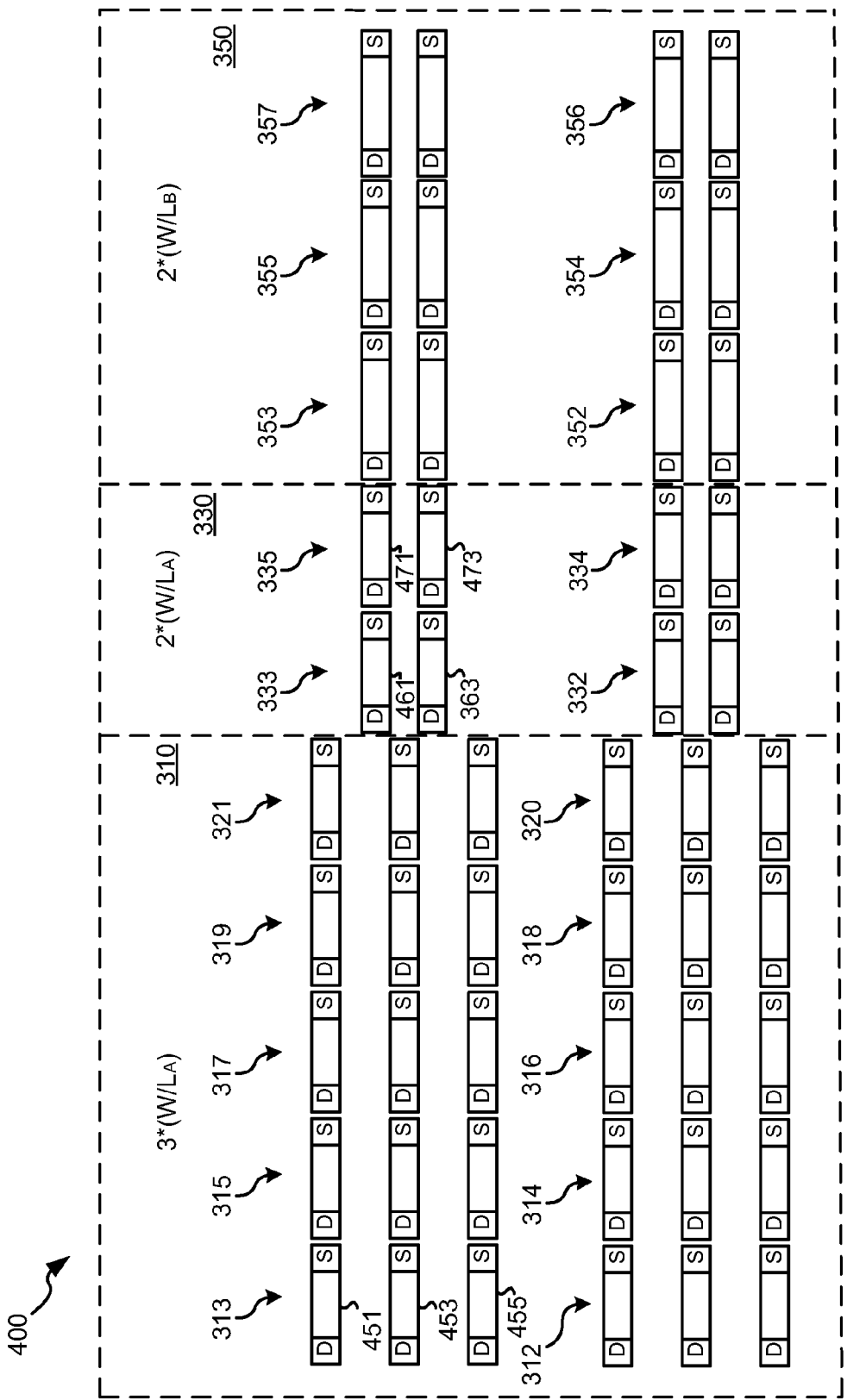
FIG. 4 depicts an exemplary layout of the differential pair of FIG. 3.

Turning to FIG. 4, the aforementioned tapering from drain to source of the effective transistor is shown in the form of an exemplary layout 400 of differential pair 300. Each of component transistors 312, 313, 314, 315, 316, 317, 318, 319, 320, 321, 332, 333, 334, 335, 352, 353, 354, 355, 356, 357 is created from one or more fingers. For example, component transistor 313 is formed from three fingers 451, 453, 455 (i.e., N=3). Each of the fingers in group 310 has a width W and a length $L_A$. As another example, component transistor 333 is formed from two fingers 461, 463 (i.e., N/K=2). Each of the fingers in group 330 has the same width and length as the fingers in group 310. As yet another example, component transistor 353 is formed from two fingers 471, 473 (i.e., N/K=2). Each of the fingers in group 350 has the same width as the fingers in groups 310, 330, but a longer length ($L_B$) than that of the fingers in groups 310, 330. As used herein, the phrase "finger" identifies a transistor element that includes a source element (labeled S), a drain element (labeled D) and a channel element extending between the source and the drain. The length of a finger is the distance from the source element to the drain element, and the width is the distance across a cross section of the channel element extending from the source element to the drain element. As an example, component transistor 313 is created by electrically coupling the sources of fingers 451, 453, 455 together to form a composite source, and by electrically coupling the drains of fingers 451, 453, 455 together to form a composite drain. The composite drains and sources are electrically coupled in accordance with the schematic of FIG. 3.

The effective channels discussed above in relation to FIG. 3 extend between the composite drain of component transistor 313 and the composite source of component transistor 357; and between the composite drain of component transistor 312 and the composite source of component transistor 356. As shown, varying the width of transistors that are used results in a tapered effective channel that has a larger cross-sectional width near the drain end (e.g., near the composite drain of component transistor 313) than that near the source end (e.g., near the composite drain of component transistor 357). As used herein, an effective channel that is shaped through use of different sizes of transistors is referred to as an "electrically shaped" channel or a channel with an "electrical shape". It should be noted that the example of FIG. 4 results in an effective channel with a particular electrical shape. Based on the disclosure provided herein, one of ordinary skill in the art will recognize a number of other electrical shapes that may be achieved in accordance with different embodiments of the present invention through use of different numbers of component transistors, fingers, and/or finger dimensions.

It should be noted that exemplary layout 400 is one of many possible layouts that may be implemented in accordance with different embodiments of the present invention. In particular, the various fingers may be aligned to allow for simplified interconnection and/or area savings. In addition, the various fingers may be inter-digitated to co-locate portions of matching transistors. Based on the disclosure provided herein, one of ordinary skill in the art will recognize a variety of layouts, finger widths and/or finger lengths that may be utilized in accordance with the various embodiments of the present invention.

Figure 5:
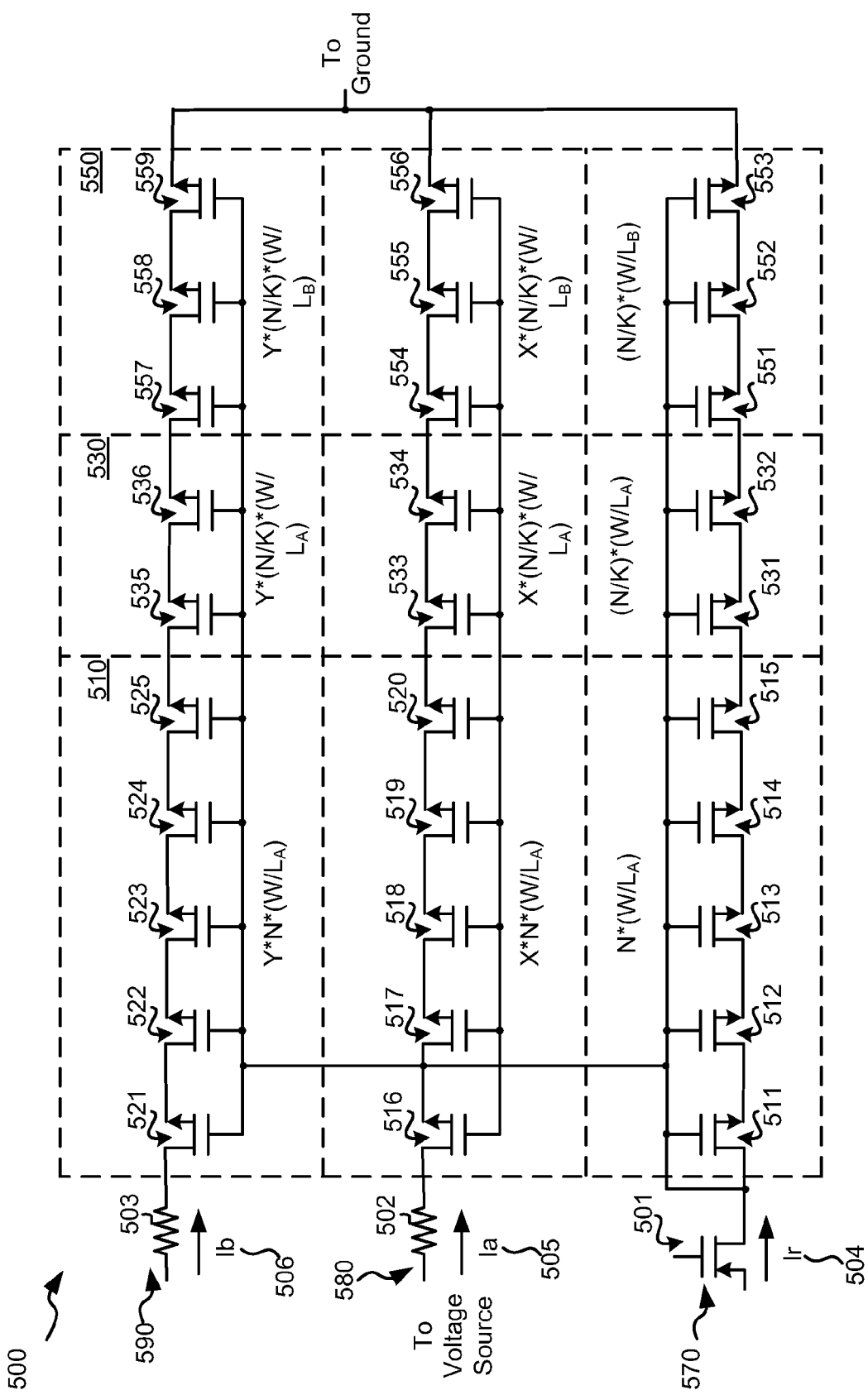
FIG. 5 shows a current mirror formed of multiple component transistors to yield effective channels where a cross-sectional width of the channels near the drain is greater than the cross-sectional width near the source in accordance with some embodiments of the present invention.

FIG. 5 shows a current mirror 500 formed of multiple component transistors to yield effective channels where a cross-sectional width of the channels near the drain is greater than the cross-sectional width near the source in accordance with some embodiments of the present invention. Similar to that discussed above in relation to FIG. 4, current mirror 500 may be laid out such that a tapered effective channel is achieved through use of a number of different sizes of component transistors. Again, it should be noted that based on the disclosure provided herein, one of ordinary skill in the art will recognize a number of different electrical shapes that may be achieved for an effective channel in accordance with one or more embodiments of the present invention.

Current mirror 500 includes three current stages 570, 580, 590. Current stage 570 generates a reference current 504 (Ir), and includes a PMOS transistor 501 and a number of component transistors 511, 512, 513, 514, 515, 531, 532, 551, 552, 553. Current stage 580 generates a proportional current 505 (Ia) that is proportional to reference current 504, and includes a resistor 502 and a number of component transistors 516, 517, 518, 519, 520, 533, 534, 554, 555, 556. Current stage 590 generates a proportional current 506 (Ib) that is proportional to reference current 504, and includes a resistor 503 and a number of component transistors 521, 522, 523, 524, 525, 535, 536, 557, 558, 559. It should be noted that while current mirror 500 is implemented using NMOS component transistors, other embodiments of the present invention may be implemented using PMOS component transistors. Based on the disclosure provided herein, one of ordinary skill in the art will recognize various combinations of component transistors that may be used in relation to different embodiments of the present invention.

Each of current stages 570, 580, 590 includes an effective NMOS transistor exhibiting an effective channel. In particular, current stage 570 includes an effective NMOS transistor with an effective channel that extends from the drain of component transistor 511 to the source of component transistor 553; current stage 580 includes an effective NMOS transistor with an effective channel that extends from the drain of component transistor 516 to the source of component transistor 556; and current stage 590 includes an effective NMOS transistor with an effective channel that extends from the drain of component transistor 521 to the source of component transistor 559. Ia and Ib vary in proportion to Ir as described by the following equations:

$$Ia = Ir * \left[ \frac{\text{Area of Effective Channel of Current Stage 580}}{\text{Area of Effective Channel of Current Stage 570}} \right];$$

and $$Ib = Ir * \left[ \frac{\text{Area of Effective Channel of Current Stage 590}}{\text{Area of Effective Channel of Current Stage 570}} \right].$$

For current stage 570, the drain of PMOS transistor 501 is electrically coupled to the drain of component transistor 511; the source of component transistor 511 is electrically coupled to the drain of component transistor 512; the source of component transistor 512 is electrically coupled to the drain of component transistor 513; the source of component transistor 513 is electrically coupled to the drain of component transistor 514; the source of component transistor 514 is electrically coupled to the drain of component transistor 515; the source of component transistor 515 is electrically coupled to the drain of component transistor 531; the source of component transistor 531 is electrically coupled to the drain of component transistor 532; the source of component transistor 532 is electrically coupled to the drain of component transistor 551; the source of component transistor 551 is electrically coupled to the drain of component transistor 552; the source of component transistor 552 is electrically coupled to the drain of component transistor 553; and the source of component transistor 553 is electrically coupled to ground. For current stage 580, resistor 502 is electrically coupled to the drain of component transistor 516; the source of component transistor 516 is electrically coupled to the drain of component transistor 517; the source of component transistor 517 is electrically coupled to the drain of component transistor 518; the source of component transistor 518 is electrically coupled to the drain of component transistor 519; the source of component transistor 519 is electrically coupled to the drain of component transistor 520; the source of component transistor 520 is electrically coupled to the drain of component transistor 533; the source of component transistor 533 is electrically coupled to the drain of component transistor 534; the source of component transistor 534 is electrically coupled to the drain of component transistor 554; the source of component transistor 554 is electrically coupled to the drain of component transistor 555; the source of component transistor 555 is electrically coupled to the drain of component transistor 556; and the source of component transistor 556 is electrically coupled to a ground. For current stage 590, resistor 502 is electrically coupled to the drain of component transistor 516; the source of component transistor 516 is electrically coupled to the drain of component transistor 517; the source of component transistor 517 is electrically coupled to the drain of component transistor 518; the source of component transistor 518 is electrically coupled to the drain of component transistor 519; the source of component transistor 519 is electrically coupled to the drain of component transistor 520; the source of component transistor 520 is electrically coupled to the drain of component transistor 533; the source of component transistor 533 is electrically coupled to the drain of component transistor 534; the source of component transistor 534 is electrically coupled to the drain of component transistor 554; the source of component transistor 554 is electrically coupled to the drain of component transistor 555; the source of component transistor 555 is electrically coupled to the drain of component transistor 556; and the source of component transistor 556 is electrically coupled to a ground.

Similar to that described in relation to differential pair 300 of FIG. 3, the effective channels are electrically shaped through use of different sizes of component transistors. The aforementioned component transistors a collected into groups of component transistors. In particular, component transistors 511, 512, 513, 514, 515 are included in a group 510, and are each of a size $N*(W/L_A)$. Component transistors 516, 517, 518, 519, 520 are included in group 510, and are each of a size $X*N*(W/L_A)$; and component transistors 521, 522, 523, 524, 525 are included in group 510, and are each of a size $Y*N*(W/L_A)$. N, X*N and Y*N is the number of fingers included in each of the transistors, W is the width of each of the fingers, and $L_A$ is the length of each of the fingers. Component transistors 531, 532 are included in a group 530, and are each of a size $(N/K)*(W/L_A)$. Component transistors 533, 534 are included in group 530, and are each of a size $X*(N/K)*(W/L_A)$; and component transistors 535, 536 are included in group 530, and are each of a size $Y*(N/K)*(W/L_A)$. (N/K), X*(N/K) and Y*(N/K) is the number of fingers included in each of the transistors. Component transistors 551, 552, 553 are included in a group 550, and are each of a size $(N/K)*(W/L_B)$. Component transistors 554, 555, 556 are included in group 550, and are each of a size $X*(N/K)*(W/L_B)$; and component transistors 557, 558, 559 are included in group 550, and are each of a size $Y*(N/K)*(W/L_B)$. Again, (N/K), X*(N/K) and Y*(N/K) is the number of fingers included in each of the transistors, and $L_B$ is the length of each of the fingers. Accordingly, the equations defining the relationship between Ir, Ia and Ib may be restated as follows:

$$Ia=Ir*X;\text{ and}$$

$$Ib=Ir*Y.$$

Figure 6:
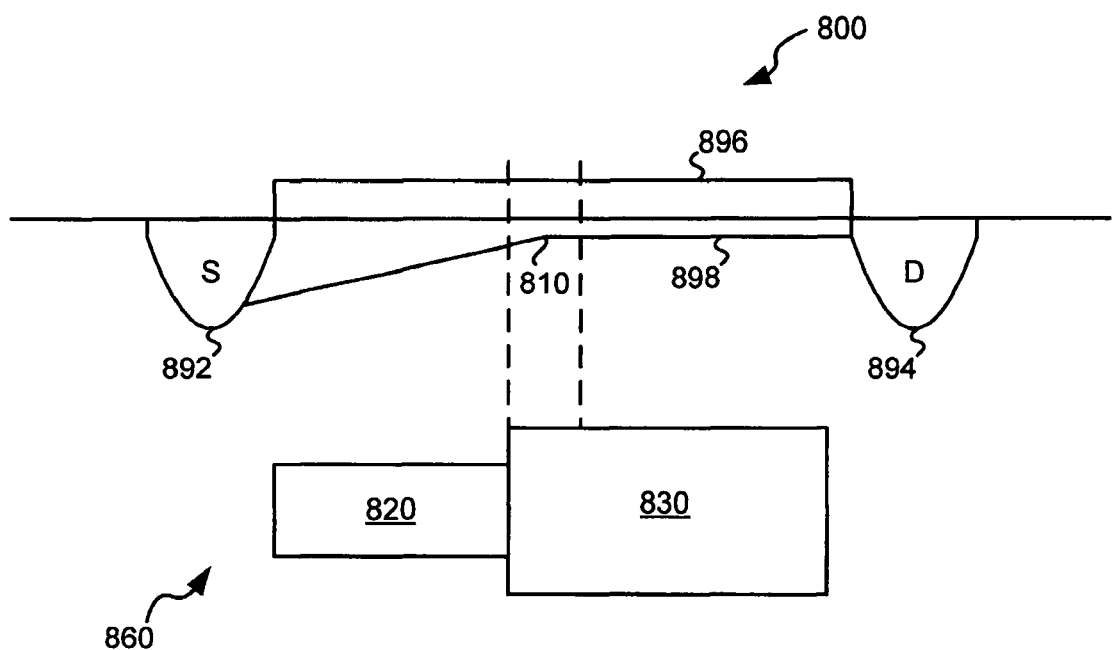
FIG. 6 shows a transistor pinch off point in relation to a combination small channel area and large channel area in accordance with yet other embodiments of the present invention.

Turning to FIG. 6, a transistor 800 including a transistor pinch off point 810 is shown in relation to a two-dimensional view of a combination small channel area 820 and large channel area 830 in accordance with yet other embodiments of the present invention. In particular, transistor 800 includes a source 892, a drain 894 and a gate 896. A channel 898 extends between source 892 and drain 894 under gate 896. A two-dimensional view 860 of channel 898 is included. Of note, channel 898 is wider near drain 894 than near source 892. This may be accomplished by using two rectangular areas (i.e., small channel area 820 and large channel area 830) as shown, or by other approaches such as, for example, using three or more rectangular areas or using a tapered area. Based on the disclosure provided herein, one of ordinary skill in the art will recognize a variety of geometries and approaches that may be used in relation to different embodiments of the present invention for implementing a channel with a differential width between the source and drain of a transistor.

As shown, during operation of transistor 800, charge distributes toward source 892 with pinch off point 810 being established along channel 898 when a voltage is applied at gate 896. Control of charge transfer through channel 898 is greatest at pinch off point 810. Thus, some embodiments of the present invention are implemented to assure that pinch off point 810 occurs within the channel at a location where the channel is relatively wide. Thus, in this case, transistor 800 is designed such that pinch off point 810 occurs within large channel area 830. This increases control over the field developed in channel 898 as larger channel area 830 provides for less variation in the applied control field. Thus, greater control is had without an increase in the entire width of channel 898. It should be noted that some embodiments of the present invention may provide a channel that is substantially the same width near both the source and the drain, but with a bulge around the area where a pinch off point is expected to develop. Such a design may also provide for increased control without requiring an overall expansion of the channel width.

Some methods in accordance with different embodiments of the present invention include providing a transistor with a channel of variable width. The methods further include designing the transistor such that the pinch off point occurs over a region of the channel that is larger than other regions of the channel.

In conclusion, the invention provides novel systems, devices, methods and arrangements for improved FET matching. While detailed descriptions of one or more embodiments of the invention have been given above, various alternatives, modifications, and equivalents will be apparent to those skilled in the art without varying from the spirit of the invention. For example, physically shaped transistors in accordance with embodiments of the present invention may include one or more source/drain/channel elements. As another example, electrically shaped transistors in accordance with different embodiments of the present invention may include any number of component transistors of any number of shapes. Such component transistors may be electrically coupled to produce an effective transistor with an effective channel of desired proportions. Therefore, the above description should not be taken as limiting the scope of the invention, which is defined by the appended claims.

What is claimed is:

1. A transistor circuit, wherein the transistor circuit comprises:
   a transistor pair, the transistor pair including:
   a first transistor including:
   a first drain having a first side and a second side;
   a first source having a third side and a fourth side, wherein the first side is closer to the third side than to the fourth side, wherein the first side is closer to the third side than the second side is to the third side; and a first channel extending between the first drain and the first source, wherein a cross-sectional width of the first channel at the third side of the first source is substantially less than a cross-sectional width of the first channel at the first side of the first drain, wherein the first drain is the closest drain disposed over the first channel to the third side, wherein a gate extends continuously from one lateral side of the gate to another lateral side of the gate, the gate extending across the first channel such that a cross-sectional width of the first channel at the one lateral side is greater than the cross-sectional width of the first channel at the other lateral side;

a second transistor including:

a second drain and a second source, wherein a second channel extends between the second drain and the second source, wherein a cross-sectional width of the second channel near the second source is less than a cross-sectional width of the second channel near the second drain, wherein the second drain includes a fifth side and a sixth side, wherein the second source includes a seventh side and an eighth side; wherein the fifth side is closer to the seventh side than to the eighth side; wherein the fifth side is closer to the seventh side than the sixth side is to the seventh side; wherein the second drain is the closest drain to the third side; wherein the second channel varies in cross-sectional width from the seventh side of the second source to the fifth side of the second drain.

2. The transistor pair of claim 1, wherein the transistor pair is implemented as a differential pair, and wherein an area of the first channel is approximately the same as the area of the second channel.

3. The transistor pair of claim 1, wherein the transistor pair is implemented as part of a current mirror, and wherein a proportional current provided by the current minor is a reference current multiplied by a ratio of an area of the first channel and an area of the second channel.

4. The transistor pair of claim 1, wherein the first channel is physically shaped such that a first cross-sectional width of the first channel near the first source is less than a second cross-sectional width of the first channel near the first drain.

5. The transistor pair of claim 4, wherein an edge of the first channel is selected from a group consisting of: a stepped edge and a smooth edge.

6. The transistor of claim 1, wherein the first transistor and the second transistor are electrically coupled such that a transistor channel is an effective channel extending from a drain of one of the first transistor and the second transistor to a source of another of the first transistor and the second transistor.

7. The transistor of claim 6, wherein the first transistor is a different size than the second transistor, wherein the effective channel has a first cross-sectional width near the source and a second cross-sectional width near the drain, and wherein the first cross-sectional width is less than the second cross-sectional width.

8. An electrical circuit, the electrical circuit comprising:

a first transistor, wherein the first transistor includes a first drain having a first side and a second side, and a first source having a third side and a fourth side; wherein the first side is closer to the third side than to the fourth side; wherein the first side is closer to the third side than the second side is to the third side; wherein the first transistor includes a first channel extending from the first drain to the first source, and wherein the first channel varies in cross-sectional width from the third side of the first source to the first side of the first drain; and a second transistor, wherein the second transistor includes a second drain and a second source, wherein the second transistor includes a second channel extending from the second drain to the second source, and wherein the second channel varies in cross-sectional width from the second source to the second drain, and wherein the second drain is the closest drain to the third side.

9. The electrical circuit of claim 8, wherein the first channel is shaped such that a first cross-sectional width of the first channel near the third side of the first source is less than a second cross-sectional width of the first channel near the first side of the first drain.

10. The electrical circuit of claim 8, wherein the first transistor includes a plurality of component transistors, wherein the plurality of component transistors are electrically coupled such that the first channel is an effective channel extending from a drain of one of the plurality of component transistors to a source of another of the plurality of component transistors.

11. The electrical circuit of claim 8, wherein the electrical circuit is a current mirror.

12. The electrical circuit of claim 8, wherein the electrical circuit is a differential pair.

13. A transistor circuit, wherein the circuit comprises:

a first transistor including:

a first node and a second node; wherein the first node includes a first side and a second side; wherein the second node includes a third side and a fourth side; wherein the first side is closer to the third side than to the fourth side, wherein the first side is closer to the third side than the second side is to the third side; and a first channel extending between the first node and the second node, wherein a cross-sectional width of the first channel near the first side of the first node is less than a cross-sectional width of the first channel near the third side of the second node, a second transistor including:

a third node and a fourth node; and a second channel extending between the third node and the fourth node, wherein a cross-sectional width of the second channel near the third node is less than a cross-sectional width of the second channel near the fourth node, wherein the fourth node includes a fifth side and a sixth side, wherein the third node includes a seventh side and an eighth side; wherein the fifth side is closer to the seventh side than to the eighth side; wherein the fifth side is closer to the seventh side than the sixth side is to the seventh side: wherein the fourth node is the closest drain to the first side; wherein the second channel varies in cross-sectional width from the seventh side of the third node to the fifth side of the fourth node; and a gate disposed over both the first channel and the second channel, wherein the gate extends continuously from a first lateral side of the gate to a second lateral side of the gate, and wherein the gate extends across the first channel such that a cross-sectional width of the first channel at the first lateral side is greater than the cross-sectional width of the first channel at the second lateral side.

14. The circuit of claim 13, wherein the first transistor further includes:

a fifth node and a sixth node;

a third channel extending between the fifth node and the sixth node, wherein a cross-sectional width of the third channel near the fifth node is less than a cross-sectional width of the third channel near the sixth node; and wherein the gate is disposed over the third channel.

15. The circuit of claim 14, wherein the first node is located nearer to the sixth node than to the fifth node.

16. The circuit of claim 13, wherein the second transistor further includes:
a fifth node and a sixth node;
a third channel extending between the fifth node and the sixth node, wherein a cross-sectional width of the third channel near the fifth node is less than a cross-sectional width of the third channel near the sixth node; and
wherein the gate is disposed over the third channel.

17. The circuit of claim 16, wherein the third node is located nearer to the sixth node than to the fifth node.

18. The circuit of claim 13, wherein the first node is a first source of the first transistor, wherein the second node is a first drain of the first transistor, wherein the third node is a second source of the second transistor, and wherein the fourth node is a second drain of the second transistor.

19. The circuit of claim 13, wherein the first transistor and the second transistor are implemented as a differential pair.

20. The circuit of claim 19, wherein the area of the first channel is approximately the same as the area of the second channel.

21. The circuit of claim 13, wherein the first transistor and the second transistor are part of a current mirror, and wherein a proportional current provided by the current mirror is a reference current multiplied by a ratio of the area of the first channel and the area of the second channel.

22. The circuit of claim 13, wherein an edge of the first channel is selected from a group consisting of: a stepped edge and a smooth edge.

23. The circuit of claim 13, wherein the first transistor includes a plurality of component transistors, wherein the plurality of component transistors are electrically coupled such that the channel is an effective channel extending from a drain of one of the plurality of component transistors to a source of another of the plurality of component transistors.

24. The circuit of claim 23, wherein the plurality of component transistors includes transistors of at least two different sizes, wherein the effective channel has a first cross-sectional width near the source and a second cross-sectional width near the drain, and wherein the first cross-sectional width is less than the second cross-sectional width.

25. The transistor of claim 1, wherein the first drain is closer to the second source than to the second drain.

26. The electrical circuit of claim 8, wherein the first drain is closer to the second source than to the second drain.

27. The electrical circuit of claim 8, wherein the second drain includes a fifth side and a sixth side, wherein the second source includes a seventh side and an eighth side; wherein the fifth side is closer to the seventh side than to the eighth side; wherein the fifth side is closer to the seventh side than the sixth side is to the seventh side; wherein the second channel varies in cross-sectional width from the seventh side of the second source to the fifth side of the second drain.

28. The circuit of claim 13, wherein the gate extends across the second channel such that a cross-sectional width of the second channel at the first lateral side is less than the cross-sectional width of the second channel at the second lateral side.

* * * * *